United States Patent [19]

Dries et al.

[11] Patent Number: 4,598,414
[45] Date of Patent: Jul. 1, 1986

[54] INPUT COMPRESSION APPARATUS FOR CHARGE COUPLED DEVICES

[75] Inventors: Michael F. Dries, Chanhassen, Minn.; Mark N. Gurnee, Framingham, Mass.

[73] Assignee: Honeywell Inc., Minneapolis, Minn.

[21] Appl. No.: 665,089

[22] Filed: Oct. 26, 1984

Related U.S. Application Data

[63] Continuation of Ser. No. 332,061, Dec. 18, 1981, abandoned.

[51] Int. Cl.[4] .................. G11C 19/28; H01L 29/78
[52] U.S. Cl. ........................................ 377/58; 377/60; 357/24
[58] Field of Search ................. 357/24, 30; 377/57–63

[56] References Cited

U.S. PATENT DOCUMENTS

| | | | |
|---|---|---|---|
| 3,903,543 | 9/1975 | Smith | 357/24 LR |
| 3,953,733 | 4/1976 | Levine | 357/24 R |
| 4,124,862 | 11/1978 | Engeler et al. | 357/24 R |
| 4,377,755 | 3/1983 | Jensen | 357/24 R |

*Primary Examiner*—Gene M. Munson
*Attorney, Agent, or Firm*—John S. Solakian; Albin Medved

[57] ABSTRACT

An input circuit coupled to receive a signal from a detector and compressing the input current representative of such signal with a fixed compression curve before injection of a charge representative thereof into a charge coupled device shift register, thereby accommodating a large dynamic range of input signal.

13 Claims, 3 Drawing Figures

INPUT COMPRESSION APPARATUS FOR CHARGE COUPLED DEVICES

This application is a continuation of application Ser. No. 332,061, filed Dec. 18, 1981, now abandoned.

BACKGROUND OF THE INVENTION

The present invention generally relates to charge coupled devices (CCDs) and, more particularly, to input circuits for charge coupled devices.

The application of infrared detectors to imaging is growing steadily. As advanced infrared systems are being developed, the requirement for greater sensitivity and resolution is desired for many applications. System performance parameters relating to these requirements always depend on the signal to noise ratio of the many individual detectors comprising the focal plane. The use of multielement focal planes of small closely packed detectors, made possible by the use of charge coupled devices, has helped reduce the noise in such systems, while allowing use of a large number of detectors, and, therefore, better satisfy the sensitivity and resolution requirements.

The coupling circuit between the detectors and the CCDs must transform the signal information from the detectors into charges in the CCD shift registers with minimum degradation of the signal-to-noise ratio of the system. The input circuit must tailor the signal so that the CCD charge capacity is not exceeded when the signal, including the background signal, varies over the system dynamic range. In addition, the CCD must be protected from excess charge from signals beyond the system dynamic range, because excess charge injected into the CCD from one detector input will mix with charge from other inputs, thereby causing so-called image blooming and loss of information.

The gain of such input circuits must be uniform so that every CCD channel has the desired maximum signal capability without saturating the CCD. Some focal plane applications require the capability of handling a very large dynamic range, and, therefore, a very large range of signal or input current to the CCDs. For example, in some applications, the background seen by the detector varies over a range of up to 10,000 to 1. In addition, the input circuit must handle this large range of inputs while maintaining a low noise figure. An ac detector/CCD coupling approach has previously been used in an attempt to handle this dynamic range, however, it has been found that this approach is strongly susceptible to CCD input nonuniformities and CCD input low frequency noise. Further, such approach has no radiometric capability. A technique for handling moderate dynamic range, sometimes referred to as the Charge Equilibrium (CE) circuit, provides charge buffering by use of charge reduction or low gain. This technique reduces noise by use of a standard charge splitting circuit. For further information on these techniques, see the articles entitled "IR/CCD Hybrid Focal Planes" by R. Broudy et al, published in The Proceedings of the Society of Photo-optical Instrumentation Engineers (SPIE), Volume 132, 1978, and "Multiplexed Intrinsic Detector Arrays With Signal Processing (MIDASP)" by M. Gurnee et al, published in The Proceedings of the Society of Photo-optical Instrumentation Engineers (SPIE), Volume 217, 1980.

It is, accordingly, a primary object of the present invention to provide an input circuit for charge coupled devices which circuit may be used in focal plane applications having a large dynamic range.

SUMMARY OF THE INVENTION

The purposes and objects of the present invention are achieved according to the present invention by providing apparatus for compressing an input signal received from a detector so as to accommodate a large dynamic range of such signal without loss of the information represented by such signal, such apparatus including first, second and third storage elements, the first for receiving the input signal, the second coupled to receive such signal from the first storage element, and the third coupled by use of a gate for receipt of the signal, or portion thereof, from the second storage element. In combination with such gate, there is provided further apparatus for enabling all of the signal to be transferred to a receiving device for low levels of the signal, and for enabling only a portion of the signal to be so transferred for medium and high levels of such signal.

BRIEF DESCRIPTION OF THE DRAWINGS

The above and other objects of the present invention are achieved in an illustrative embodiment as described with respect to the Figures in which.

DETAILED DESCRIPTION OF THE PREFERRED EMBODIMENT(S)

Figure 1:
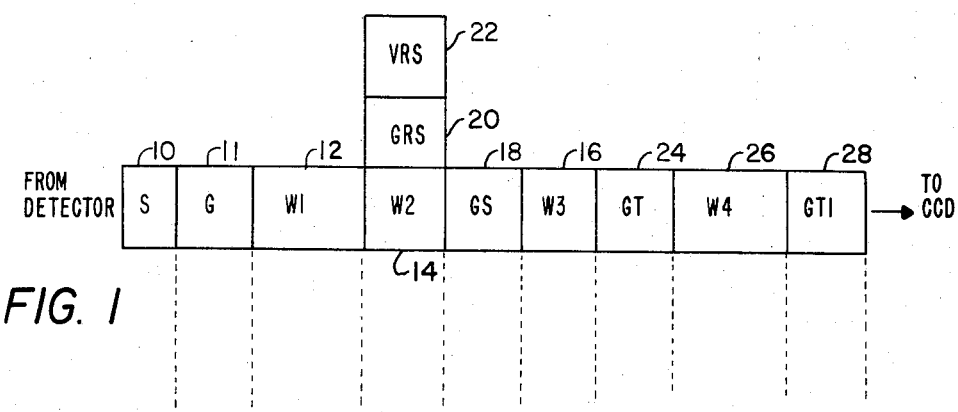
FIG. 1 illustrates the configuration of the input circuit of the present invention.
Figure 2:
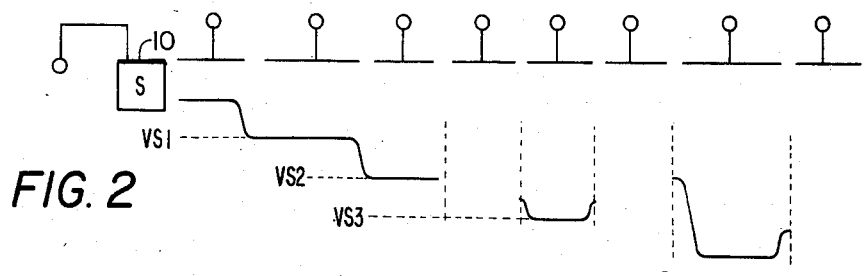
FIG. 2 illustrates the potentials applied to the various gates and the charge storage capacity of the various wells of the input circuit of the present invention.

FIG. 1 illustrates the input circuit of the present invention. An input current is coupled for receipt from a detector via source 10 and gate 11. The input circuit includes three potential wells, (W1) 12, (W2) 14 and (W3) 16. These wells are used to store minority charge carriers along the surface of a semiconductor just below insulated conductive regions (as shown in FIG. 2), which are biased with respect to the underlying crystal by an applied potential of a few volts. The greater the potential applied, then the deeper the well is, and more charge can be stored in the deeper wells. The input circuit of the present invention utilizes, for example, three (3) different potentials, VS1, VS2 and VS3, as shown in FIG. 2. The potential VS1 is applied to (W1) 12, VS2 applied to (W2) 14, and VS3 applied to (W3) 16. The potential VS1, is lower in magnitude than VS2, which in turn is lower than VS3. However, it can be seen that the potential VS3 could be lower than potential VS2.

Gate 11 is utilized to enable input current from the detector to flow into well (W1) 12 at a controlled rate determined by the system. In addition to gate 11, gate (GS) 18 is utilized to transfer charge into well (W3) 16 and isolate it there in accordance with system timing. Gate (GRS) 20 is enabled at the appropriate time to reset, i.e., empty, the contents of wells 12 and 14 by use of reset voltage (VRS) 22. Gate (GT) 24 is enabled when the charge in well 16 is to be transferred to the charge coupled device (CCD). This transfer to the CCD may be directly from gate 24 or may, in the alternative, be made through well (W4) 26 and gate (GT1) 28.

Figure 3:
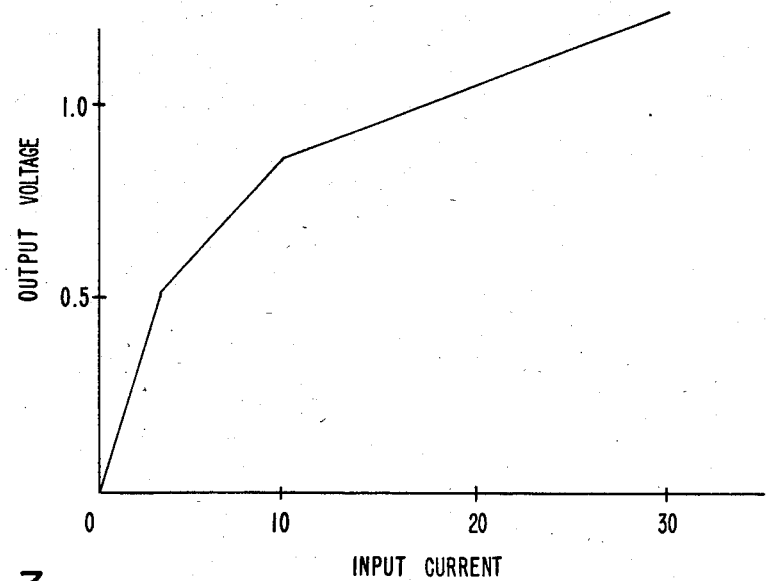
FIG. 3 illustrates the input compression characteristics of the input circuit of the present invention.

As described hereinafter, it will be seen that for low input currents, the input circuit of the present invention will have approximately unity gain, whereas, for midrange and high input currents, the gain will be reduced. The input/output gain curve shown in FIG. 3 illustrates a typical gain of the circuit of FIG. 1. Three different gain curves can be seen in FIG. 3 for various input currents. The output voltage (to the CCD) is shown on the vertical axis. By use of different gains, the input current is "compressed" with the fixed gain or compression curve of FIG. 3 before injection of the charge into the CCD, which may take the form of a well-known CCD shift register.

The operation of the input circuit, the configuration of which, and surface potentials for which, are shown in FIGS. 1 and 2, which Figures are aligned as indicated by the dotted lines, shall now be discussed.

At low background or signal level, the input current flows through wells 12 and 14 into well 16. Gate 11 is enabled continuously to allow such current flow, whereas gate 18 is enabled to allow current to flow into well 16. At low input current, all of the charge will be found stored in well 16 after gate 18 is disabled. At this time, the charge in well 16 will be transferred to the CCD (assuming that W4 and GT1 are not used). For large, but intermediate, input currents, well 16 will be filled above the level of potential VS2 such that charge is stored in both wells 16 and 14. Gate 18 is then disabled and the charge in well 16 is transferred to the CCD. The charge in well 14 is removed by resetting to substantially zero (i.e., discarding the charge) well 14 by the use of voltage (VRS) 22 when gate 20 is enabled. The incremental gain under these intermediate input conditions is given by the capacitance of gate 16 divided by the sum of the capacitance of gates 16 and 18, or setting W to be the capacitance for the respective wells, then gain equals W3/(W3+W2).

At high background and/or signal conditions, wells 16 and 14 are filled above potential VS2 and, therefore, charge is stored in the combination of wells 16, 14 and 12. When gate 18 is disabled, the charge stored in well 16 is transferred to the CCD. Following such transfer, the charge stored in wells 12 and 14 is reset by use of gate 20 and potential 22. The incremental gain under these high input conditions is given by the capacitance of well 16 divided by the sum of the capacitance of wells 16, 14 and 12, or gain equals W3/(W1+W2+W3).

It can be seen that the relative potentials on each storage well and the number of wells can be optimized for a specific application. That is, there may be more than three wells for any particular application. Further, a single large well with a potential variation, i.e., a continuous storage depth variation, along it can be formed, for example, by use of a resistive drop in a polysilicon gate, thereby providing a smooth compression characteristic.

It can also be seen that a so-called accumulator well (W4) 26 may be used. The accumulator well 26, coupled between gate 24 and gate 28, provides additional storage between the detector and the CCD. Accumulator well 26 is deeper than the other wells and may be used to collect and accumulate the charge received from well 16 for several input sample periods until such time as gate 28 is enabled to transfer the total charge in well 26 to the CCD. The accumulator well is utilized where unusually high input currents are encountered, enabling the operation of wells 12, 14 and 16, as hereinbefore described to effect a gain less than one, a number of times, and summing many of the small charge packets from well 16 into well 26 before transferring the accumulated charge packet to the CCD. In this manner, the input well combination of wells 12, 14 and 16 may be filled many times before a signal packet is transferred to the CCD, and therefore the apparatus of the present invention can handle a signal level many times what otherwise might be handled without the accumulator well 26. It can be seen that since the signal of these signal packets adds in an algebraic manner, the noise included therein adds in an RMS manner, and, accordingly, by the use of such accumulator well 26, the signal-to-noise ratio of the system is improved.

Having described the invention, what is claimed as new and novel and for which it is desired to secure Letters Patent is:

1. Apparatus for compressing an input signal so as to accommodate a large dynamic range of said signal without loss of information represented by said signal, said apparatus comprising:
   A. first storage means for receiving said input signal;
   B. second storage means for receiving all or a portion of said signal from said first storage means;
   C. third storage means for receiving all or a portion of said signal from said second storage means;
   D. first gate means coupled between said second and third storage means so as to selectively inhibit the transfer of all or a portion of said signal from said second storage means to said third storage means;
   E. means for coupling said third storage means for transfer of all or a portion of said signal to a receiving device;
   F. wherein each of said first, second and third storage means is coupled to store said signal or portion thereof depending upon the storage potential thereof, and wherein the storage potential of said first storage means is less than the storage potential of said second storage means; and
   G. an accumulator storage means for successively accumulating a predetermined number of portions of said input signal transferred from said third storage means prior to receipt thereof by said receiving device.

2. Apparatus as in claim 1 wherein said storage potential is determined by voltage levels applied to bias each one of said storage means.

3. Apparatus as in claim 2 wherein the voltage level applied to bias said first storage means is less than the voltage level to bias said second storage means.

4. Apparatus as in claim 1 wherein the voltage level applied to bias said accumulator storage means is greater than the voltage level applied to bias said third storage means.

5. Apparatus for compressing an input signal so as to accommodate a large dynamic range of said signal without loss of information represented by said signal, said apparatus comprising:
   A. first storage means for receiving said input signal;
   B. second storage means for receiving all or a portion of said signal from said first storage means;
   C. third storage means for receiving all or a portion of said signal from said second storage means;
   D. first gate means coupled between said second and third storage means so as to selectively inhibit the transfer of all or a portion of said signal from said second storage means to said third storage means;

E. means for coupling said third storage means for transfer of all or a portion of said signal to a receiving device;

F. means, including said first gate means, for enabling substantially all of said signal to be received by said receiving device for low levels of said signal, and for enabling only a portion of said signal to be received by said receiving device for other than low levels of said signal; and G. wherein each of said first, second and third storage means is coupled to store said signal or portion thereof depending upon the storage potential thereof, wherein the storage potential of said first storage means is less than the storage potential of said second storage means, wherein said storage potential is determined by voltage levels applied to bias each one of said storage means, wherein the voltage level applied to bias said first storage means is less than the voltage level to bias said second storage means, and wherein the voltage level applied to bias said second storage means is greater than the voltage level applied to bias said third storage means.

6. Apparatus for compressing an input signal so as to accommodate a large dynamic range of said signal without loss of information represented by said signal, said apparatus comprising:

A. first storage means for receiving said input signal;
B. second storage means for receiving said signal from said first storage means;
C. third storage means;
D. first gate means coupled between said second and third storage means so as to selectively inhibit the transfer of said signal from said second storage means to said third storage means;
E. means for coupling said third storage means for transfer of said signal to a receiving device;
F. means, including said first gate means, for enabling substantially all of said signal to be received by said receiving device for low levels of said signal, and for enabling only a portion of said signal to be received by said receiving device for other than low levels of said signal, and
G. accumulator storage means for successively accumulating a predetermined number of portions of said input signal transferred from said third storage means prior to receipt thereof by said receiving device.

7. Apparatus as in claim 6 wherein the storage potential of said accumulator storage means is greater than the storage potential of said third storage means.

8. Apparatus for compressing an input signal so as to accommodate a large dynamic range of said signal without loss of information represented by said signal, said apparatus comprising:

A. first storage means for receiving said input signal;
B. second storage means for receiving all or a portion of said signal from said first storage means;
C. third storage means for receiving all or a portion of said signal from said second storage means;
D. first gate means coupled between said second and third storage means so as to selectively inhibit the transfer of all or a portion of said signal from said second storage means to said third storage means;
E. means for coupling said third storage means for transfer of all or a portion of said signal to a receiving device;
F. means for enabling said apparatus to have different signal gains dependent upon and inversely related to the amplitude of said input signal, said means for enabling comprising:
   (1) means, including said first gate means, for enabling substantially all of said signal to be received by said receiving device for relatively low levels of said signal, and for enabling only a portion of said signal to be received by said receiving device for other than low levels of said signal, and
   (2) means for discarding that portion of said signal remaining in said first and second storage means when that portion of said signal in said third storage means is transferred to said receiving device; and
G. accumulator storage means for successively accumulating a predetermined number of portions of said input signal transferred from said third storage means prior to receipt thereof by said receiving device.

9. Apparatus as in claim 8 wherein the storage potential of said accumulator storage means is greater than the storage potential of said third storage means.

10. Apparatus for compressing an input signal so as to accommodate a large dynamic range of said signal without loss of information represented by said signal, said apparatus comprising:

A. first storage means for receiving said input signal;
B. second storage means for receiving all or a portion of said signal from said first storage means;
C. third storage means for receiving all or a portion of said signal from said second storage means;
D. first gate means coupled between said second and third storage means so as to selectively inhibit the transfer of all or a portion of said signal from said second storage means to said third storage means;
E. means for coupling said third storage means for transfer of all or a portion of said signal to a receiving device;
F. means for enabling said apparatus to have different signal gains dependent upon and inversely related to the amplitude of said input signal, said means for enabling comprising:
   (1) means, including said first gate means, for enabling substantially all of said signal to be received by said receiving device for relatively low levels of said signal, and for enabling only a portion of said signal to be received by said receiving device for other than low levels of said signal, and
   (2) means for discarding that portion of said signal remaining in said first and second storage means when that portion of said signal in said third storage means is transferred to said receiving device; and wherein
G. the storage potential of said third storage means is less than the storage potential of said second storage means.

11. Apparatus for compressing an input signal so as to accommodate a large dynamic range of said signal without loss of information represented by said signal, said apparatus comprising:

A. first storage means for receiving said input signal;
B. second storage means for receiving all or a portion of said signal from said first storage means;
C. third storage means for receiving all or a portion of said signal from said second storage means;

D. first gate means coupled between said second and third storage means so as to selectively inhibit the transfer of all or a portion of said signal from said second storage means to said third storage means;

E. means for coupling said third storage means for transfer of all or a portion of said signal to a receiving device;

F. means for enabling said apparatus to have different signal gains dependent upon and inversely related to the amplitude of said input signal, said means for enabling comprising:

(1) means, including said first gate means, for enabling substantially all of said signal to be received by said receiving device for relatively low levels of said signal, and for enabling only a portion of said signal to be received by said receiving device for other than low levels of said signal, and (2) means for discarding that portion of said signal remaining in said first and second storage means when that portion of said signal in said third storage means is transferred to said receiving device;

G. wherein each of said first, second and third storage means is coupled to store said signal or portion thereof depending upon the storage potential thereof, wherein the storage potential of said first storage means is less than the storage potential of said second storage means, wherein said storage potential is determined by voltage levels applied to bias each one of said storage means, wherein the voltage level applied to bias said first storage means is less than the voltage level to bias said second storage means, and wherein the voltage level applied to bias said second storage means is greater than the voltage level applied to bias said third storage means.

12. Apparatus as in claim 11 further comprising an accumulator storage means for successively accumulating a predetermined number of portions of said input signal transferred from said third storage means prior to receipt thereof by said receiving device.

13. Apparatus as in claim 12 wherein the voltage level applied to bias said accumulator storage means is greater than the voltage level applied to bias said third storage means.

* * * * *